US012754215B2

(12) United States Patent
Houis et al.

(10) Patent No.: US 12,754,215 B2
(45) Date of Patent: Oct. 6, 2026

(54) CURRENT SENSOR FOR MULTIPLE CURRENTS

(71) Applicant: Melexis Technologies SA, Bevaix (CH)

(72) Inventors: Simon Houis, Bevaix (CH); Adrian Hill, Novi, MI (US); Bruno Boury, Tessenderlo (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 135 days.

(21) Appl. No.: 18/537,349

(22) Filed: Dec. 12, 2023

(65) Prior Publication Data

US 2024/0219429 A1 Jul. 4, 2024

(30) Foreign Application Priority Data

Dec. 28, 2022 (EP) .................................... 22217035

(51) Int. Cl.

*G01R 15/20* (2006.01)
*G01R 19/00* (2006.01)
*G01R 33/07* (2006.01)

(52) U.S. Cl.

CPC ....... *G01R 15/207* (2013.01); *G01R 19/0092* (2013.01); *G01R 33/072* (2013.01); *G01R 15/202* (2013.01)

(58) Field of Classification Search

None
See application file for complete search history.

(56) References Cited

U.S. PATENT DOCUMENTS

| | | | | |
|---|---|---|---|---|
| 5,473,244 | A * | 12/1995 | Libove ................. | G01R 15/142 324/130 |
| 8,564,250 | B2 | 10/2013 | Tamura | |
| 10,215,780 | B2 | 2/2019 | Shimizu | |
| 10,712,369 | B2 * | 7/2020 | Lerner ................. | G01R 33/072 |
| 11,402,409 | B1 * | 8/2022 | McNally .............. | G01R 15/207 |
| 11,747,369 | B2 | 9/2023 | Houis | |
| 11,899,047 | B1 * | 2/2024 | Theuss ................... | G01R 19/10 |
| 2015/0309127 | A1 | 10/2015 | Ausserlechner | |
| 2018/0306843 | A1 | 10/2018 | Bussing et al. | |

(Continued)

FOREIGN PATENT DOCUMENTS

| | | | |
|---|---|---|---|
| CN | 102193015 | A | 9/2011 |
| CN | 107250813 | A | 10/2017 |

(Continued)

OTHER PUBLICATIONS

Msaed A. et al.: "A Simple and Accurate Magnetic Gradient Sensor Configuration Dedicated to Electrical Currents Measurements", vol. 7, No. 3, Jun. 1, 2009, pp. 497-502.

(Continued)

*Primary Examiner* — Rodney E Fuller
(74) *Attorney, Agent, or Firm* — Workman Nydegger

(57) ABSTRACT

A current sensor for sensing a current through two different conductors. The sensor comprises a magnetic sensor configured to read a magnetic field induced by the first and second currents. The sensor is configured also to provide a first signal representative of a magnetic field parameter in a first direction and configured to provide at least a second signal representative of a magnetic field parameter in a second direction different from the first direction.

14 Claims, 8 Drawing Sheets

(56) References Cited

U.S. PATENT DOCUMENTS

| | | | |
|---|---|---|---|
| 2020/0057097 A1 | 2/2020 | Vuillermet et al. | |
| 2020/0057120 A1 | 2/2020 | Belin et al. | |
| 2020/0191835 A1* | 6/2020 | Bilbao De Mendizabal | G01R 33/0011 |
| 2020/0400516 A1 | 12/2020 | Bilbao De Mendizabal | |
| 2021/0311136 A1* | 10/2021 | Augendre | G01R 19/0092 |

FOREIGN PATENT DOCUMENTS

| | | | | | |
|---|---|---|---|---|---|
| CN | 113945747 | A | | 1/2022 | |
| CN | 114252677 | A | * | 3/2022 | G01R 19/0092 |
| EP | 1030183 | B1 | * | 3/2006 | G01R 1/07 |
| WO | WO-2019072421 | A1 | * | 4/2019 | G01R 15/205 |

OTHER PUBLICATIONS

Chirtsov Andrey et al.: "Three-Phase Busbar Current Transducer", IEEE Magnetics Letters, vol. 10, As Early as Jun. 1, 2019, pp. 1-5.

Weiss Roland et al.: "Crosstalk in Circular Arrays of Magnetic Sensors for Current Measurement", IEEE Transactions on Industrial Electronics, vol. 64, No. 6, Jun. 1, 2017, pp. 4903-4909.

Melexis: "Current Sensors Reference Design Guide", Aug. 1, 2016, retrieved from https://www.mouser.com/pdfdocs/Current-Sensors-Design-Guide-Application-Note-Melexis1.pdf.

Extended European Search Report from corresponding EP Application No. 22217035.9, Jun. 2, 2023.

Chinese Office Action from Corresponding Chinese Patent Application No. CN202311832141.5, Feb. 10, 2026.

* cited by examiner

CURRENT SENSOR FOR MULTIPLE CURRENTS

FIELD OF THE INVENTION

The invention relates to the field of current sensing. More specifically it relates to current sensors and systems which sense the current through a conductor by detecting the magnetic field induced by the current through that conductor.

BACKGROUND OF THE INVENTION

In many systems, it is required to know accurately the current flowing through a conductor. Such is the case with multiphase current systems (e.g. in electric motors and such). The measurement of the currents is traditionally done by measuring magnetic fields induced by the current through the conductor. Magnetic sensors are used in contactless magnetic sensing. The current is calculated from the measured magnetic field.

However, the magnetic sensor measures the field at a given position, and the magnetic field at that position is influenced not only by the intended conductor, but also by parasitic fields, stray fields and such. Usually, these systems include more than one conductor, and it is required to know the current through each conductor. Since these conductors also carry current and generate magnetic fields, there is a high chance that the signal in the magnetic sensor of a conductor becomes 'contaminated' with signals from nearby conductors. This is usually known as crosstalk, which negatively impacts the reading of the sensor due to magnetic fields induced by nearby conductors other than the intended conductor carrying the current to be measured. Gradiometric and common-mode magnetic sensing are affected by this source of error. While crosstalk can be reduced by physically separating the conductors, the separation has practical limits in those applications wherein the current systems need to be compact. In some cases, compensation of crosstalk can be done by calculation, however this requires a high computational cost.

It would be desirable to provide an effective reading of currents through a plurality of conductors, with reduced degradation of the measurement due to crosstalk in a reasonably compact layout.

SUMMARY OF THE INVENTION

It is an object of embodiments of the present invention to provide a compact sensor for measuring currents through a plurality of conductors. It is an object to provide a sensing system including the compact sensor and a set of conductors, such as bus bars, for accurate and compact current measurement through the conductors of the set.

In a first aspect, the present invention provides a current sensor for sensing a first current through a first conductor and for sensing a second current through at least a second conductor different from the first. The sensor comprises a magnetic sensor configured to read a magnetic field induced by the first and second currents. The sensor is configured also to provide a first signal representative of a magnetic field parameter in a first direction (e.g. the magnetic field in a particular direction or field component, e.g. the gradient of a field component) and configured to provide at least a second signal representative of a magnetic field parameter in a second direction different from the first direction.

The sensor further comprises a processing unit programmed for deriving a first output signal and a second output signal, based on weighted combinations of the first signal and the at least second signal from the magnetic sensor. The weight coefficients (or simply weights) of the weighted combination are chosen such that the first output signal is indicative of the first current and the second output signal is indicative of the second current.

It is an advantage of embodiments of the present invention that a number of sensors lower than the number of conductors can be used to obtain the current through each conductor. It is an advantage that a current sensor is provided for inverter applications.

In some embodiments of the present invention, the processing unit is programmed with constants such that the output signal indicative of the current in one conductor is proportional to one component of the magnetic field or one gradient of the magnetic field.

It is an advantage of embodiments of the present invention that the equation system to be solved is straightforward, for the case in which the conductors are in different planes so that the contribution of the current in the field is maximal in one direction and negligible in at least the second direction.

In some embodiments of the present invention, the sensor is adapted for sensing a further third current through a third conductor different from the first and second conductors. The sensor is configured to provide a third output signal representative of the third current. The processing unit is programmed for deriving the third current based on a weighted combination of the first, second and third signals.

It is an advantage of embodiments of the present invention that three currents flowing through three different conductors can be measured. It is an additional advantage that the currents of a 3 phase AC currents, for an inverter or the like, can be characterized, e.g. using two or only one sensor.

In some embodiments of the present invention, the magnetic sensor is further configured to provide a third signal representative of a magnetic field parameter in a third direction different from the first and the second directions.

It is an advantage of embodiments of the present invention that a single current sensor, for example with a single magnetic sensor, can be used for characterizing the currents in three conductors, for example for an inverter.

In some embodiments of the present invention, the magnetic sensor comprises at least two magnetic sensing elements.

It is an advantage of embodiments of the present invention that, for example, Hall sensing elements can measure field components and differential field components with an easy implementation.

In some embodiments of the present invention, the magnetic sensor is adapted to measure the magnetic field substantially at the same location. For example the magnetic sensor may comprise at least two sensing elements separated by 1 mm or less, or by 200 microns or less, or by 30 microns or less.

It is an advantage of embodiments of the present invention that the field overlapping can be measured substantially in the same region.

In some embodiments of the present invention, the magnetic sensor and processing unit are provided in a single sensor package comprising contacts for outputting processed signals from the processing unit.

It is an advantage of embodiments of the present invention that a current sensor chip can be provided integrated as a single package.

In some embodiments of the present invention, a first and at least second conductors are also provided in the sensor package, wherein the current sensor is at a fixed position relative to the conductors, optionally overlapping the conductors and wherein the sensor package further comprises contacts for providing the currents to be measured through the conductors of the sensor package. The sensor package may be also provided on a PCB and one or more of the conductors may be provided as conductive tracks on the PCB.

It is an advantage of embodiments of the present invention that the positioning of the magnetic sensor can be fixed with respect to the conductors.

In an aspect, the present invention provides a sensing system comprising the current sensor of the previous aspect, further comprising at least a first and a second conductor. The current sensor is positioned so as to measure the overlapped magnetic field induced by the conductors. Optionally the current sensor at least partially overlaps at least one of the conductors.

It is an advantage of embodiments of the present invention that a single sensor can provide reading of current through at least two different conductors. It is an advantage that the system can be part of inverter applications.

In some embodiments of the present invention, the first conductor and second conductor are positioned so that a limited region can be defined, wherein the magnetic field parameter in one direction has a null contribution from the first conductor, and the magnetic field parameter in the other direction has a null contribution from the second conductor. The current sensor is positioned in said region, and it is sensitive in both directions.

It is an advantage of embodiments of the present invention that calibration is easier, since some weights are zero.

In some embodiments of the present invention, the first conductor extends so that the current flows in a first direction and the second conductor extends so that the current flows in a second direction different from the first, optionally being perpendicular direction.

It is an advantage of embodiments of the present invention that the mechanical integration is easier and can be made compact.

In some embodiments of the present invention, each conductor is separated by a distance from the magnetic sensor of the current sensor, and the spacing between at least two of the conductors less than 5 times the distance between any of the conductors and the magnetic sensor.

It is an advantage of embodiments of the present invention that the magnetic field of both conductors can effectively be sensed by a single sensor in the same place, and the signal presents a high signal-to-noise ratio.

In some embodiments of the present invention, a first conductor extends in a first direction and the second conductor extends parallel to the first conductor in a different plane. The second conductor is a bus bar with a portion extending longitudinally, the portion being delimited by two cutouts on opposite sides of the bus bar so the current through that portion travels perpendicularly to the first conductor. The current sensor receives the magnetic field from the first conductor and from the portion delimited by cutouts in the second conductor.

It is an advantage of embodiments of the present invention that two currents flowing in perpendicular directions can be obtained in a compact way, without having to lay the bus bars themselves perpendicular to each other.

In some embodiments of the present invention, a third conductor is included for flowing current. The current sensor is further arranged to detect the current through the third conductor, at least a portion of the third conductor being arranged parallel to any one of the first or second conductor.

It is an advantage of embodiments of the present invention that the currents used in an inverter can be characterized by a single current sensor.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
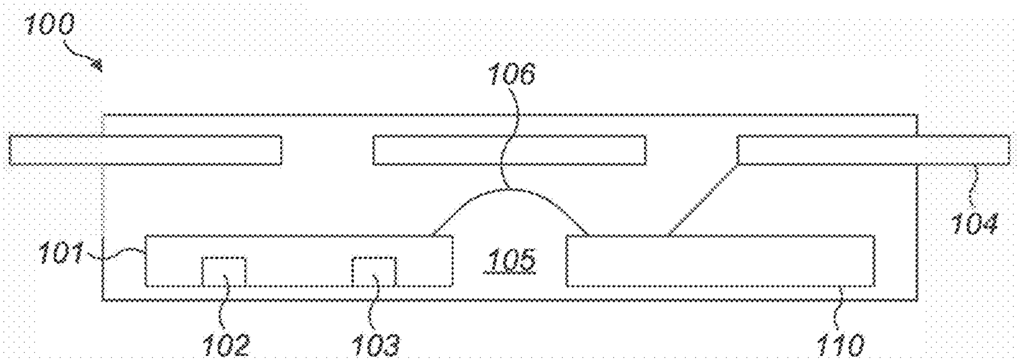
FIG. 1 illustrates a current sensor including a magnetic sensor and a processing unit.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "magnetic field parameter", reference is made to a directional parameter derived from the magnetic field, for example a magnetic field component in a direction, e.g. Bx, By and Bz. A magnetic field parameter also includes for example the variation in a direction of a field component in a difference direction, for example the difference of the component Bz in two positions distanced in the x direction. Where the distance is small, the difference is the gradient dBz/dx, for example. Thus the magnetic field parameter in a direction may be dBz/dx while the magnetic field parameter in a different direction may be dBz/dy. The present invention relates to current sensors. Measuring currents is necessary in many applications, for example measuring currents through the bus bar of an inverter or the like. Automotive applications especially, but not only, benefit from compact design. However this needs to be balanced with accuracy of current measurement. Since measuring the current through a conductor is usually done by magnetic means, and the currents through a plurality of conductors need to be measured, the magnetic fields of nearby conductors may affect a sensor, which is then affected by cross-talk signals. When using several current sensors for detecting the current through respective bus bars, the cross talk needs to be reduced, for example by distancing the sensors from bus bars other than the relevant bus bar carrying the current to be detected. Instead, the inventors followed the opposite path by optimizing compact layout. The present invention provides a current sensor capable of sensing two or more currents flowing through respective conductors, using a single magnetic sensor, rather than using a magnetic sensor per conductor.

The current sensor includes a magnetic sensor able to measure at least two magnetic field components in two different directions from currents through a plurality of conductors, for example some specific three-phase inverter bus bar arrangements. More than one magnetic field quantity (e.g. at least 2) is measured, for example simultaneously, in order to retrieve the current running into at least 2 bus bars. Notably, this can be done with a single sensor. This allows therefore to reduce the amount of sensors required by a user to achieve the system functions. For example, the reduction can be done from the usual three to two, or even one current sensor. This is advantageous in many applications, e.g. inverter applications.

In a first aspect, the present invention relates to a current sensor that includes a magnetic sensor which senses the magnetic field in a region and provides at least two signals. Each signal depends on a component of the magnetic field in different directions, in other words, a first signal depends on a component of the field in a first direction, and at least a second signal is provided, which depends on a component of the field in a second, different, direction. The directions may be perpendicular to each other.

The magnetic sensor may be adapted to provide a signal proportional to the magnetic field in one direction, for two or more different directions, e.g. perpendicular directions. The present invention is not limited thereto. For example, it may be adapted to provide a signal proportional to the gradient of the field, or rather the gradient of the field in one direction. It may be adapted to provide a combination, for example a first signal may be proportional to the gradient of a field component in a predetermined direction, and a second signal may be proportional to the gradient of the field component in a different direction.

A processing unit is configured to receive the signals from the magnetic sensor. The processing unit is programmed for deriving at least a first output signal and a second output signal, which are based on weighted combinations of the signals received from the magnetic sensor. The processing unit is programmed to perform this combination.

The weighted combinations are performed using weight coefficients, or simply 'weights', which are chosen by calibration, calculation, simulation, etc. so that the combination results in a first output signal being indicative of the current through the first conductor and a second output signal being indicative of the current through the second conductor.

FIG. 1 shows schematically a current sensor 100 in accordance with embodiments of the present invention. The current sensor comprises a magnetic sensor 101 and a processing unit 110, electrically coupled to the magnetic sensor 101. The current sensor 100 comprises signal transmitting means 104, in this case contacts, for transmitting output signals also electrically coupled to the processing unit 110. The contacts may be connected to another device for readout of the current measurements. Both the magnetic sensor and processor may be provided on a single package, for example both being covered by overmolding material 105. The output signals from the processing unit 110 may be transmitted to the contacts of the package. The processing unit 110 and the magnetic sensor 101 may be electrically coupled by a platform including contacts and tracks, or may be directly in contact by a wire 106, e.g. provided by wire bonding. Other features such as supports, leadframes and the like may be included.

However, the present invention is not limited to this configuration. For example the processing unit may not be in the same package as the magnetic sensor, although they are still coupled so the signals from the magnetic sensor can be received by the processor. Alternatively, the magnetic sensor and the processor may be provided in the same substrate, e.g. in monolithically, or in a stack.

The magnetic sensor 101 includes sensing elements 102, 103 adapted to provide the required signals, e.g. two or three signals representative of the field components in two, respectively three, different directions. This can be provided in a single chip or package, as mentioned earlier. The measurement of the magnetic field is done at substantially the same position for different directions, for example on a region with a radius of 1 mm or less, for example obtained by sensing elements being separated by 1 mm or less, for example by 200 microns or less, for example by 30 microns. Some examples of magnetic sensors are discussed with reference to FIG. 2 to FIG. 5, as follows.

In embodiments wherein the sensing elements are Hall elements, horizontal or vertical Hall plates may be provided or a combination, optionally including one or more magnetic concentrators (e.g. integrated magnetic concentrator IMC). The Hall plates and optionally MCs may be combined to provide the required signals representative of the field components in the required directions, for example two or three different directions.

Figure 2:
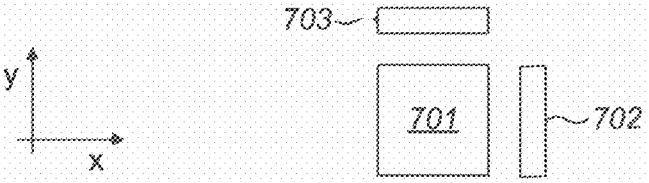
FIG. 2 to FIG. 5 illustrate different types of magnetic sensor being sensitive to the field in multiple directions.

FIG. 2 shows a horizontal Hall plate 701 combined with two vertical Hall plates 702, 703 which can be used as part of a magnetic sensor part of the current sensor in accordance with some embodiments of the present invention. They may be configured so that the signal provided by them represents the magnetic field in three different directions, e.g. three perpendicular directions. For example, the vertical plates 702, 703 are sensitive to the field in X, Y directions and the horizontal plate 701 is sensitive to the vertical component Z of the field.

In some embodiments, the current sensor (for sensing the current 11, 12 in two conductors) comprises a magnetic sensor including sensing elements such that the perpendicular components Bx, By of the field can be sensed, e.g. two vertical Hall plates (VHP) perpendicular to each other and oriented in accordance with the conductors. In this general case the magnetic field components form a linear combination:

$$\begin{pmatrix} I1 \\ I2 \end{pmatrix} = \begin{pmatrix} k1 & k2 \\ k3 & k4 \end{pmatrix} \begin{pmatrix} Bx \\ By \end{pmatrix}$$

Since in this case Bx and By are measured, it is only necessary to provide k1 . . . k4 to characterize completely the currents through each conductor. It is noted that the configuration of the orthogonal currents also result in an orthogonal matrix where k2=k3-0, so Bx is proportional to only I1 and the same for By and I2.

In some embodiments, the weight coefficients k1 . . . k4 are determined in a calibration step with different sets of currents. For example, in a first step a known currents sets are applied to the corresponding bus bar, e.g. I1=Ical and I2=0, subsequently I1=0 and I2=Ical. Under each condition, signals Bx and By are determined (e.g. measured, or simulated). Finally the equations are solved for k1, . . . , k4. These coefficients may be stored in the processing unit.

Depending on the magnetic sensor (e.g. sensing elements and distribution, combination of signals thereof, etc.), other magnetic field parameters can be measured, such as the gradients or differences. Different sensing elements would provide different equations, e.g. a horizontal Hall plate would provide a perpendicular component of the field Bz in the equation, while two horizontal Hall plates separated by a small distance would provide two signals that can be combine into one signal representative of the field in the direction of separation, the signal being representative of the gradient of the same field component in that direction. Thus, it is possible to provide for example dBz/dx and dBz/dy. Both can be combined by providing in the same sensor a first pair separated in an y direction and a second pair of sensing elements separated by a distance in the y direction, thus providing dBz/dx and dBz/dy. The current may be obtained from these measurements, in this general case:

$$\begin{pmatrix} I1 \\ I2 \end{pmatrix} = \begin{pmatrix} m1 & m2 \\ m3 & m4 \end{pmatrix} \begin{pmatrix} dBz/dx \\ dBz/dy \end{pmatrix}$$

Figure 3:
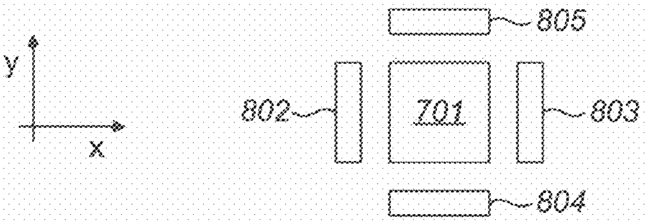

FIG. 3 shows an embodiment of a 3D magnetic sensor. The pairs of vertical Hall elements 802, 803, 804, 805 can be combined (e.g. averaged, or summed) to represent the in-plane magnetic field components (Bx, By) at the center of the 3D sensor (as compared to FIG. 2 where the magnetic field is detected in a zone slightly offset from the center), and/or to increase signal to noise ratio. In particular, the two vertical plates 802, 803 are sensitive to one horizontal component X and two other vertical plates 804, 805 are sensitive to a horizontal component Y in different direction, e.g. perpendicular, to the previous component X. In the end 3 signals are provided, representative of the magnetic field in three different directions Bx, By and Bz.

The present invention enables three measurements of the field in three different directions, at substantially the same position thus using a single magnetic sensor. The magnetic sensor provides signals representative of the field in three different directions, e.g. three different field components, difference of a component measured by two sensing elements separated in a predetermined direction which can be considered the gradient in that direction.

Figure 4:
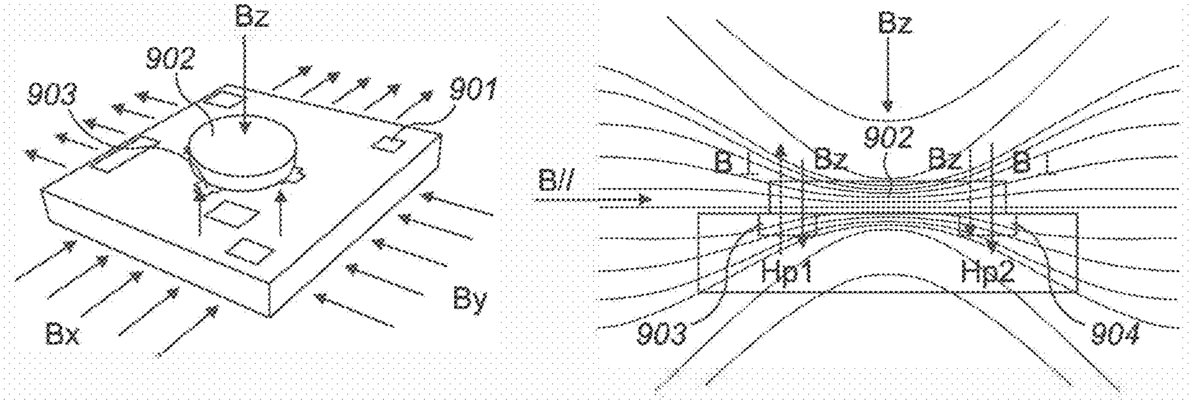
Figure 11:
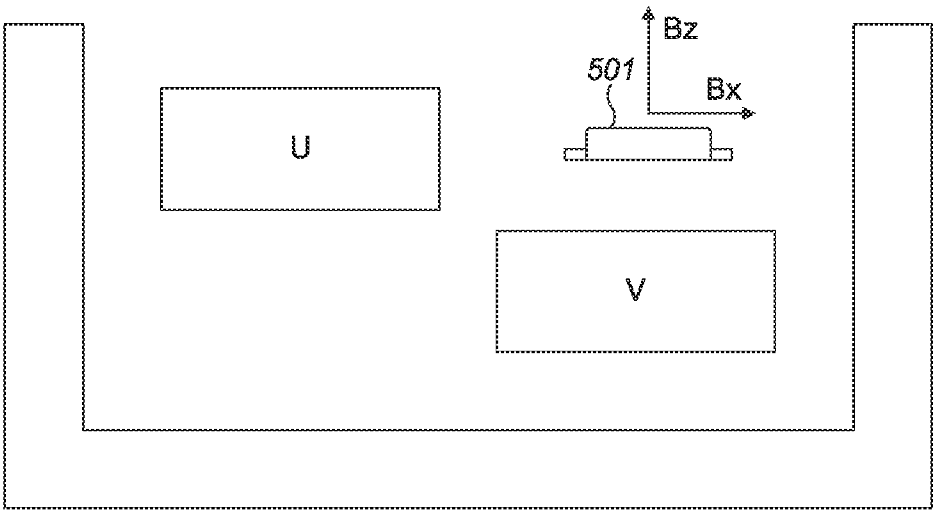
FIG. 11 illustrates two shielded parallel conductors in different planes and a sensor positioned to receive the magnetic field from both conductors.

In some embodiments of the present invention, magnetic concentrators MC can be used, e.g. an integrated MC (IMC), in combination with Hall plates. FIG. 4 shows a perspective view on the left, and a cross section on the right, of a 'point 3D magnetic sensor' with one or more Hall plates 901 distributed through the surface, to obtain differential fields for example. There is a central IMC 902 surrounded by two pairs of horizontal Hall plates 903, 904 on opposite sides of the IMC. The IMC provides redirectioning of the field lines, so the horizontal component of the field (e.g. Bx) can be redirected as a combination of a parallel component B/ and perpendicular component B⊥. The perpendicular components are detectable by the horizontal Hall plates 903, 904. In particular, the perpendicular component on one side of the IMC 902 extends in a direction (upwards) which is detectable by the first horizontal Hall plate 903 and in an opposite perpendicular direction (downwards) when crossing the second horizontal Hall plate 904 of the pair, on the other side of the IMC 902. On the other hand, the contribution of the perpendicular component Z of the field has the same direction in both Hall plates of the pair. Thus, it is possible to obtain the horizontal and vertical components by signal processing (e.g. subtracting both signals allows calculating the horizontal component Bx from the upwards and downwards component B⊥, and adding both signals allows calculating the vertical component Bz). Thus, two horizontal Hall plates and an IMC can provide Bx and Bz. Adding two horizontal Hall plates at opposite sides of the IMC in a direction perpendicular to the other two horizontal Hall plates would provide also a perpendicular component of the field, By. Also a redundant measurement of the perpendicular component Bz can be provided, which can be used to improve the measurement. In some embodiments, as seen in FIG. 11 below, the perpendicular component Bz of the field is needed. In some embodiments, 3D measurement is needed, as in the case of FIG. 12 below, wherein the current through 3 conductors can be studied with a single current sensor.

Figure 5:
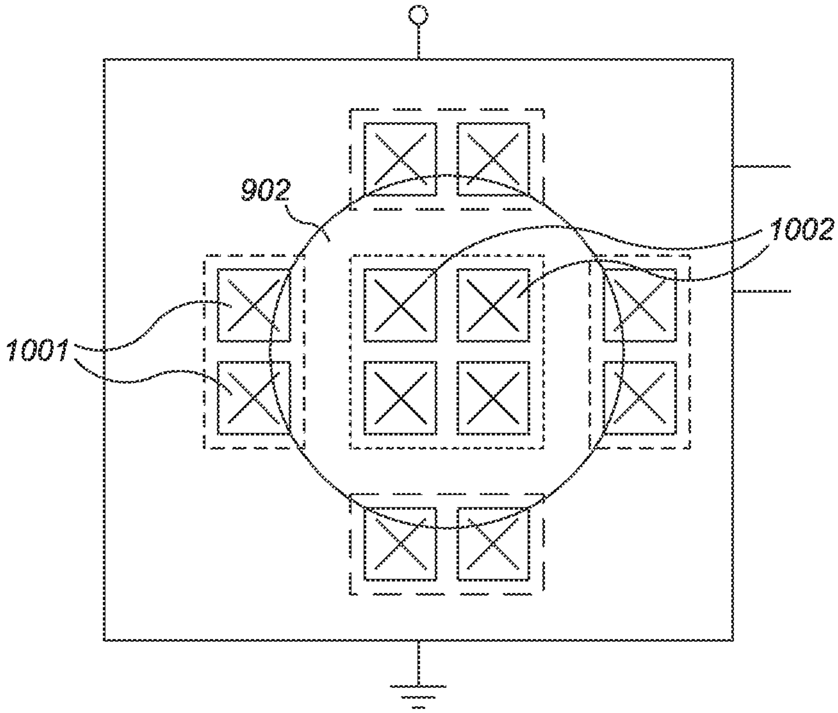

FIG. 5 shows, as a top view, an alternative embodiment of a 'point 3D magnetic sensor', which is advantageously compact as the one in FIG. 4. As before, the IMC 902 may be surrounded by horizontal Hall plates 1001 for obtaining the components of the field in two different directions X, Y as explained before. It may include additional horizontal Hall plates 1002 underneath the IMC, thus allowing saving space. For example, two pairs of Hall plates may be provided on each side of the IMC, to obtain the components Bx, By, and further four horizontal Hall plates 1002 can be placed underneath the IMC to obtain independently the vertical component Bz.

In some embodiments, the magnetic sensor 101 may be implemented as an integral unit, e.g. monolithically implemented in a semiconductor die, comprising e.g. IMCs, sensing elements including e.g. Hall plates, electronic circuitry for powering the elements, signal routing systems, and the like.

Since three different signals, representative of the field in three directions, can be obtained, an equation system with three equations can be solved for three currents, so in general:

$$\begin{pmatrix} I1 \\ I2 \\ I3 \end{pmatrix} = \begin{pmatrix} h1 & h2 & h3 \\ h4 & h5 & h6 \\ h7 & h8 & h9 \end{pmatrix} \begin{pmatrix} fx(B) \\ fy(B) \\ fz(B) \end{pmatrix}$$

The function can be representative of the field component in different directions, for example the value of the component in that direction, or the difference or gradient of the field (or of a particular component thereof) in a direction, e.g. d/dx, however the present invention can be applied to other functions (e.g. higher order derivatives, such as $d^2Bz/(dx)^2$) as long as it allows providing the currents.

As before, the particular values of the matrix coefficients depend mainly on the sensitivity of the magnetic sensor and its position relative to the conductors.

Regarding the determination of the weights, in a calibration phase, or by simulation or calculation, the idea is to apply known currents in the conductors, determine (e.g. measure) the signals of the magnetic sensors, and then solve the equations to determine the weights such that the weighted combination is equal to the known applied current. The simplest way is to apply a current in one conductor and set the others to 0, but the present invention is not limited to setting the others to 0. The number of unknowns depends on the symmetry of the system. For configurations where the contribution of one conductor influences mainly one component and not a different component (and vice versa, e.g. in FIG. 6 below) only one equation may be needed, e.g. k=I_cal/Bx_determined, but in other cases (e.g. in FIG. 10 below) two equations are needed, i.e. two different sets of currents. The calibration steps would be:

Apply Known Currents in the Conductors

- Determine a signal representative of the field in one direction, e.g. magnetic field or magnetic gradient signals associated with the applied currents
- Repeat 1 and 2 for different directions, until enough equations are obtained to solve for the weights
- Determine weights coefficients based on the known currents and determined magnetic field.

The processing unit is adapted or programmed to perform calculations including a combination of the signals provided by the magnetic sensor. The processing unit can be (pre-) programmed with weight coefficients. These can be obtained e.g. by calibration. The signals from the magnetic sensor represent the magnetic field in different directions. For example, the component of the magnetic field in a predetermined direction, or the gradient of the field, or a component thereof, can be measured in a predetermined direction, and the signal derived therefrom is fed to the processing unit. As the processing unit receives the signals from the magnetic sensor, the equation system is solved in order to obtain the currents. The weight coefficients depend on the sensitivity of the magnetic sensor and also on the positioning of the conductors relative to each other and relative to the magnetic sensor of the current sensor.

For example, for a magnetic sensor sensitive to the X and Y directions, for perpendicular conductors with at least a portion extending in the X and Y directions (the conductors being in different planes), if the sensor is positioned on the crossing of the two conductors, the contribution of the first current in the field is maximal in a first direction and negligible in at least the second direction, and the contribution of the second current is maximal in the second direction and negligible in the first. Thus, the solution is straightforward since the matrix can be set as diagonal (the weights in the antidiagonal position being null).

In summary, the current sensor of the present invention includes a magnetic sensor which senses the field in substantially the same region in the space in several directions, and it can feed data of magnetic components to a processor programmed to combine the data and obtain a set of currents which cause the magnetic field sensed by the magnetic sensor. A single sensor can provide a simultaneous measurements of a plurality of currents. The programming of the processor is done taking into account the type of magnetic sensor and, optionally, the particular application to which the sensor applies (a 3 phase inverter, bus bars, etc.).

In some embodiments, the current sensor is a packaged sensor. In some embodiments, the packaged sensor also includes conductors with a fixed position relative to the magnetic sensor, and the conductors include contacts to introduce the currents to be measured. In some embodiments, the top projection of the current sensor is at the same distance from the conductors, optionally overlapping the conductors. This is explained with reference to the last two figures, but before, different configurations of the sensor positioning with respect to the conductors will be explained in general for a current sensing system.

Hence, in an aspect, a current sensing system is provided, including the current sensor and a plurality of conductors.

The current sensor can be adapted to provide a reading of the currents through two conductors crossing preferably over the area where the current sensor is provided.

Conductors may carry AC, for example they may be inverter conductors. However, the bus bars may carry currents independent to each other, they even may carry DC.

Figure 6:
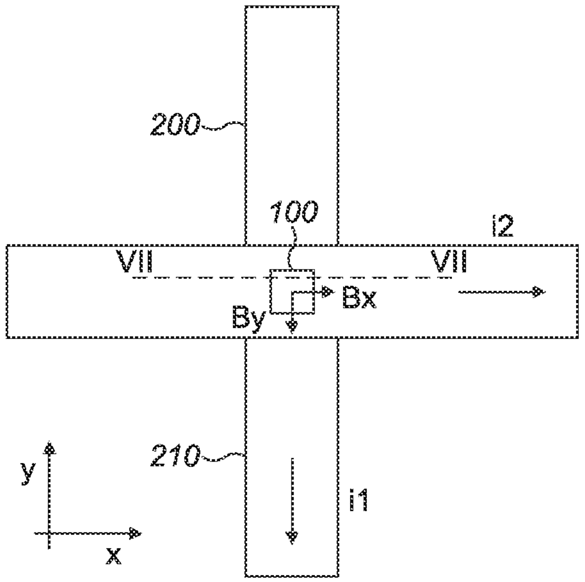
FIG. 6 is the top view of a current sensor positioned on the crossing of two conductors.

FIG. 6 shows two conductors, e.g. bus bars 200, 210 crossing perpendicularly, so the current i1 through one of the bus bars 200 flows perpendicularly to the other current i2 flowing through the other bus bar 210. The magnetic sensor is placed so that it can sense the overlapping fields generated by both currents i1, i2. In this case, the magnetic sensor is part of the package including a processor, thereby forming a current sensor 100.

In some embodiments, the magnetic sensor includes sensing elements such that the perpendicular components Bx, By of the field are sensed. In this general case the magnetic field components form a linear combination:

$$\begin{pmatrix} I1 \\ I2 \end{pmatrix} = \begin{pmatrix} k1 & k2 \\ k3 & k4 \end{pmatrix} \begin{pmatrix} Bx \\ By \end{pmatrix}$$

Since in this case Bx and By are measured, it is only necessary to provide k1 . . . k4 to characterize completely the currents through each conductor.

In some embodiments, the weight coefficients k1 . . . k4 are determined in a calibration step with different sets of currents. For example, in a first step a known currents sets are applied to the corresponding bus bar, e.g. I1=Ical and I2=0, subsequently I1=0 and I2=Ical. Under each condition, signals Bx and By are determined (e.g. measured, or simulated). Finally the equations are solved for k1, . . . , k4. It is noted that the configuration of the orthogonal currents also results in an orthogonal matrix where k2=k3=0, so Bx is proportional to only I1 and the same for By and I2.

Using a different magnetic sensor means that the equation to be solved is different (and the processor needs to be programmed accordingly). For example, the current sensor may comprise one pair of horizontal Hall plates separated in the X direction and one pair of the same separated in the Y direction, such as the gradients or directional differences of field components as explained earlier. For the case previously mentioned where dBz/dx and dBz/dy (the parameters being the gradient of the component Bz in different directions x, y) and the current may be obtained from these measurements:

$$\begin{pmatrix} I1 \\ I2 \end{pmatrix} = \begin{pmatrix} k1 & k2 \\ k3 & k4 \end{pmatrix} \begin{pmatrix} dBz/dx \\ dBz/dy \end{pmatrix}$$

For perfectly orthogonal and symmetric layout, k2=k3=0 and k1=k4. Solving such an equation is trivial. As before, the weight coefficients can be determined by calibration, for example by measurement with known currents, simulation, etc.

Figure 7:
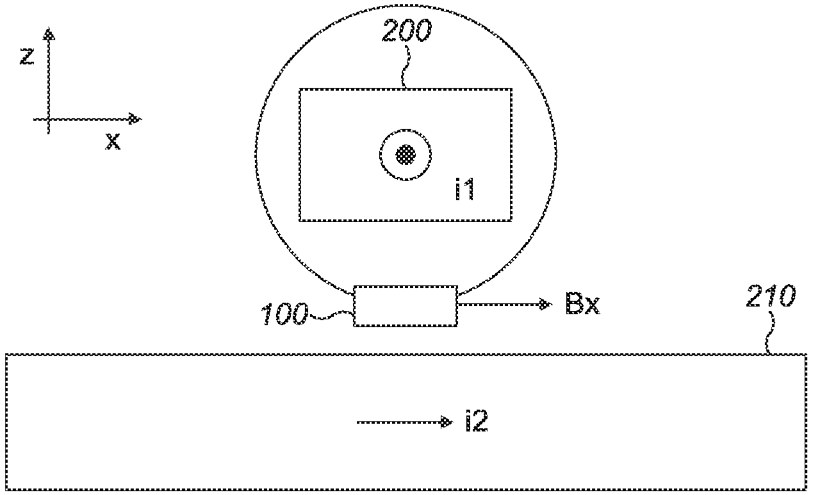
FIG. 7 is a cross section of the current sensor and conductors of FIG. 6.

In some embodiments in order to present good signal quality, the sensor may be relatively close to the bus bar. The sensor 100 may be equidistant to both bus bars, e.g. it may be sandwiched by the bus bars 200, 210. FIG. 7 shows a cross section of the bus bars and the sensor, which is indicated in FIG. 6 with the dashed line VII-VII. If the distance is the same for both conductors, the signal-to-noise ratio will be similar to both.

The distance between the sensing elements of the magnetic sensor 100 and the bus bar 200, 210 is known as the 'airgap'. A small airgap increases the signal-to-noise ratio (SNR), since the field closer to the source is stronger than farther away. In the system of FIG. 7 formed by two bus bars 200, 210 and the sandwiched current sensor 100, the spacing between the conductors is less than 5 times the airgap (or rather, the largest airgap, if the distance is not the same from the sensor to each conductor). The magnetic field of both conductors can advantageously and effectively be sensed by a single sensor in the same place, and the signal presents a high SNR.

The present invention is not limited to sandwiching a sensor between bus bars. For example, one or both of the bus bars may comprise a through-hole and the sensor may fit inside. For example, the sensor may be above the conductors. For example, the system can be presented as two, three, or more current traces in a multi-layer PCB including the current sensor.

Figure 8:
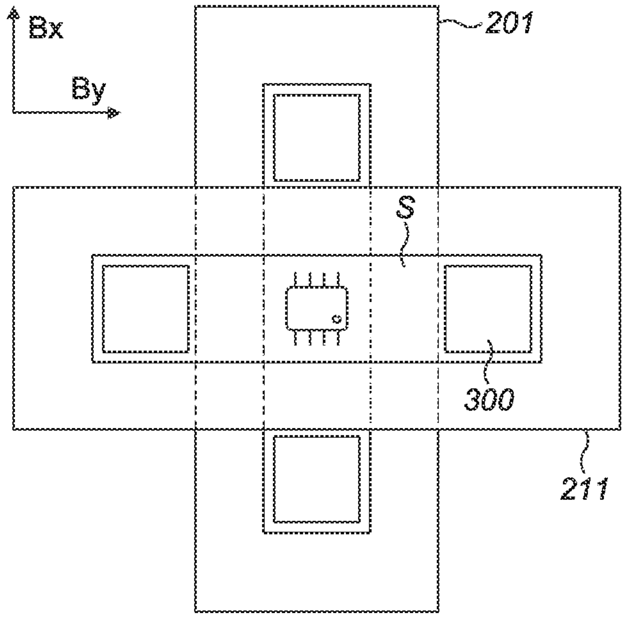
FIG. 8 is the top view of a current sensor centered with two crossing bus bars where the bus bars include in the crossing zone, where the current sensor is placed within the area left by the slits.

In some embodiments, a hole may be provided in one of the bus bars in a layout such as the cross in FIG. 6. The sensor may be accommodated in the hole so the setup can be made more compact. Advantageously, the magnetic sensor of the current sensor presents higher sensitivity to the magnetic field (e.g. more sensitive to the field components Bx, By) than if the sensor was outside. Another advantage is an improved AC response since there is less attenuation at higher frequencies. FIG. 8 shows two perpendicular bus bars 201, 211 including each an elongated hole S or slit in the overlapping region. The current sensor (or at least the magnetic sensor thereof) may be centered in the overlapping region, for example within the hole of a bus bar, for example attached to a PCB between the bus bars. The PCB may also be on top of or underneath both bus bars, the sensor placed within the hole of the bus bars. The bus bars may have a width of few millimeters, e.g. in the order of under 50 mm, e.g. 18 mm while the elongated hole may have a width slightly lower than half the width of the bus bar, e.g. the elongate hole may have a width of around 7 mm, e.g. 6 mm or 7 mm. Optionally a shield 300 can be added. For example the shield 300 may comprise columns through the hole left between the hole S of one bar 211 and the edge of the other bar 201. This allows a good shielding without making the bus bars wider, also the columns may be used to hold and optionally align the current sensor, and/or to align the bus bars. Additionally, the performance for measurements of AC is improved.

Figure 9:
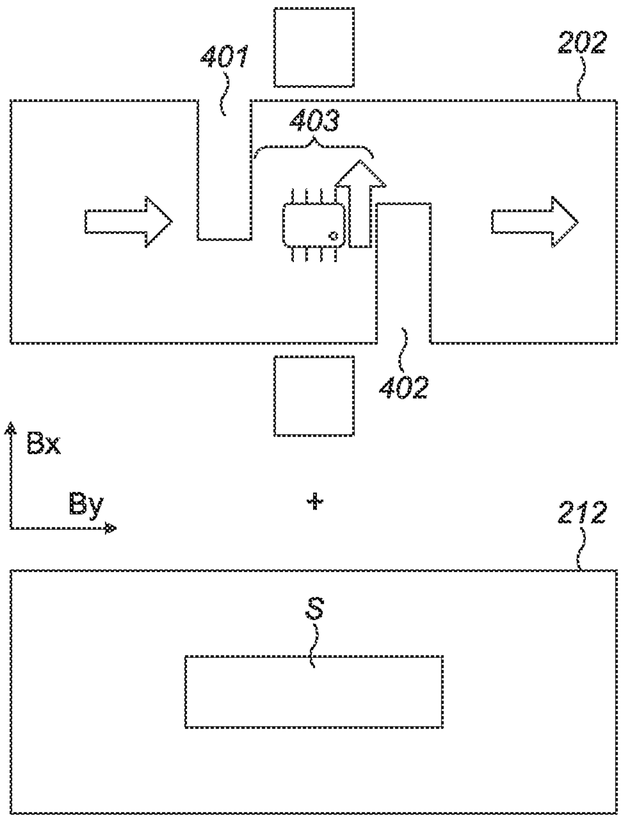
FIG. 9 illustrates two parallel conductors, one having a slit, and another having two cutouts to force the current to flow through a small portion of the conductor in a perpendicular direction with respect to the other conductor.

It is possible to provide the bus bars in a compact manner, extending in parallel to each other, for example in a stack. In order to provide a magnetic field generated by a current flowing in a perpendicular direction to the other current, it is possible to locally redirect the current flow in a perpendicular way. For example, FIG. 9 shows two conductors 202, 212 being bus bars, extending in the same direction. They are shown next to each other, but they actually form a stack in the assembled system, and they extend parallel to each other. One conductor 212 may have a slit S of e.g. 6 mm width. The other conductor 203 has two cutouts 401, 402 to change the current direction, see the thick arrows. One cutout 401, 402 is provided at each side of the bus bar, distanced in the longitudinal direction thereby forming the portion 403 through which the current flows in a different direction than through the rest of the conductor. The position of the two cutouts delimits the length of the longitudinal portion 403 of the bus bar. This portion includes the sensor, and it may be shielded as before.

Thus, the current flows towards the portion following the same direction as the current through the other conductor. Then it reaches the first cutout 401, which acts as a corner, and the current enters the portion through the necking formed by the cutout. The current exists the portion through the necking due to the second cutout 402 on the opposite side of the bus bar and continues flowing downstream in the same direction as before encountering the portion. This way, from cutout to cutout, the current flows perpendicularly relative to the current through the other conductor. It is an advantage of embodiments of the present invention that two currents flowing in perpendicular directions can be obtained in a compact way, without having to lay the bus bars themselves perpendicular to each other.

Figure 10:
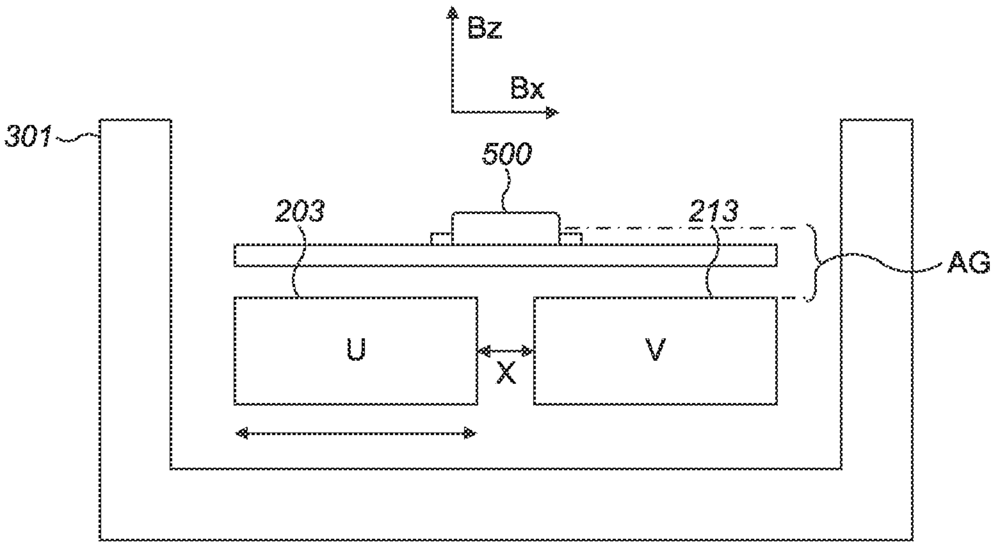
FIG. 10 illustrates two shielded coplanar conductors and a current sensor over them.

FIG. 10 shows a cross section of two coplanar bus bars 203, 213 as conductors through which current flows parallel to each other. The conductors have a predetermined thickness CT (in the perpendicular direction z) and they are separated by a distance Xs. The current sensor 500 is provided over the bus bars leaving a predetermined airgap AG between the sensor 500 and the plane comprising the closest surface of the conductors 203, 213. The current sensor 500 comprises a magnetic sensor which provides two signals whose value is determined by magnetic field components (e.g. by the magnetic field or its gradient in the direction of the component) with different directions, for example to two components perpendicular to each other. One field component Bz may be perpendicular to the direction of the current and to the largest external surface of the bus bar. The other field component Bx may be perpendicular to the direction of the current and to the other field component Bz. Thus, one signal represents Bx, the other represents Bz. The processor combines the signals with weight factors as explained earlier. The output signals of the processor represent the currents i1, i2 flowing through each bar.

In order to provide an advantageously high SNR and to allow a single sensor to sense the field simultaneously from several sensors (e.g. in a single point), the system may have the following configuration:

$Xs<5CT$, e.g. 2CT, e.g. CT, and/or $Xs<5AG$, e.g. 2AG, e.g. AG

If the spacing Xs between conductors is less than 5 times the thickness CT and/or the airgap AG (or less than twice the thickness and/or airgap, or less than the thickness and/or airgap), the field overlap will be large, providing high signal to noise ratio. This configuration contrasts with the usual prior art configurations, wherein the spacing Xs is much larger than the airgap AG between the conductor and the sensor, and much larger than the thickness CT of the conductor. For example, in the prior art, the sensors are kept relatively far apart from other conductors to avoid cross talk.

The current sensor may overlap both bus bars, for example it may be positioned over the space left between the bus bars. The bus bars may be symmetrical. However, the present invention is not limited to that configuration, and the current sensor may be positioned over one of the bus bars, where the contribution of the bus bar directly underneath the sensor is substantially the horizontal component Bx (if the sensor is centered with the conductor), and the contribution from the neighboring bus bar will have a horizontal and vertical component Bx, Bz.

In some embodiments, the bus bars may comprise a necking over which the current sensor is provided. The necking allows to locally increase current density, thus providing a higher magnetic field, further improving SNR.

As shown before, the bus bars may be at least partially surrounded by an optional shield 301, which allows reducing influence of external magnetic fields. The shield may be advantageously compact if combined with a necking of the bus bars.

The previous embodiments show the current sensor placed overlapping a gap Xs between both conductors as in FIG. 10 or overlapping the region where the bus bars cross, as in FIG. 6. However, this depends on the type of sensor, so a different magnetic sensor may require different positioning. In other embodiments, the conductors may be arranged to flow the current in the same direction, however the conductors are not coplanar. FIG. 11 shows such an example. Two conductors U, V are arranged so that the current can be positioned for allowing a maximum component of the magnetic field induced by each current being orthogonal at the sensing location. In this case, the current sensor 501 comprises a magnetic sensor being sensitive to the horizontal field component Bx and the perpendicular field component Bz. Thus, the position at which the magnetic field generated by the conductor Vis maximum in the horizontal direction X is centered with the conductor V, on top thereof. On the other hand, the position at which the field generated by the other conductor U is maximum in the perpendicular direction Z is centered with said conductor U, on its side. In other words, the center of the conductors U, V and the current sensor 501 form a 90-degree angle.

Figure 12:
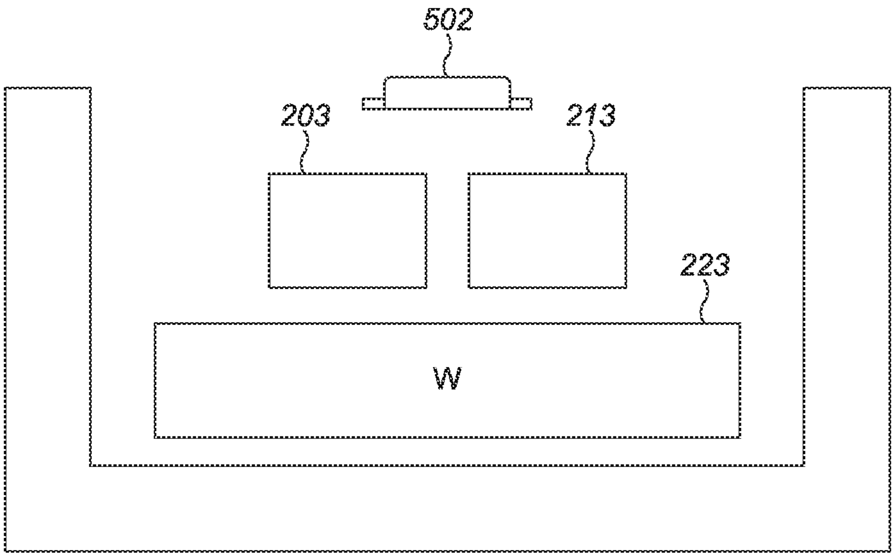
FIG. 12 illustrates three shielded conductors, two being coplanar, and a third being stacked underneath the two coplanar conductors, wherein the third comprises two slits so the current through the portion of the conductor overlapping the other two flows in a parallel direction relative to the current flowing through the coplanar conductors.

Further conductors can be added to the system. A particular inverter system usually comprises three conductors. Two current sensors may be used, one dedicated sensor for one of the conductors, and another current sensor for the remaining two conductors. In some embodiments, the system is configured so that the current through the three conductors can be measured by a single current sensor. FIG. 12 shows a system including a current sensor with a suitable magnetic sensor, and a processing unit programmed to provide three output signals based on three input signals from the magnetic sensor.

The three conductors 203, 213, 223 are arranged respective to the magnetic sensor 502 so that the magnetic field components detected by the magnetic sensor have different directions (e.g. they are perpendicular components). The magnetic sensor 502 includes suitable elements which are sensitive to the magnetic field. The magnetic sensor provides a first, second and third signals representative of the magnetic field in a first, second and third direction being different (e.g. perpendicular) from each other. The processing unit in the current sensor 502 processes these three magnetic sensor signals into output signals representative of the current in each conductor. This embodiment could be seen as a combination of FIG. 10 and FIG. 6 or FIG. 9.

Figure 13:
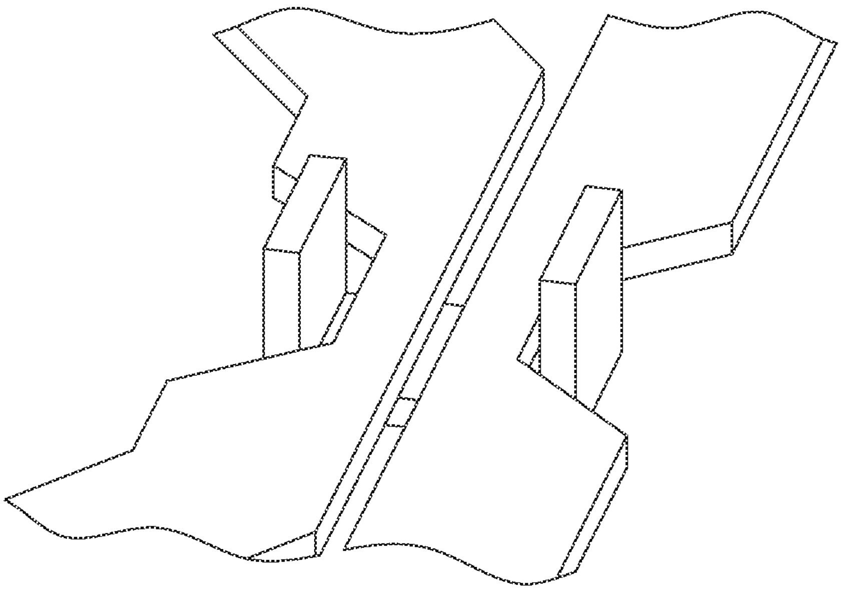
FIG. 13 is a perspective view of two shielded bus bars including a necking.
Figure 14:
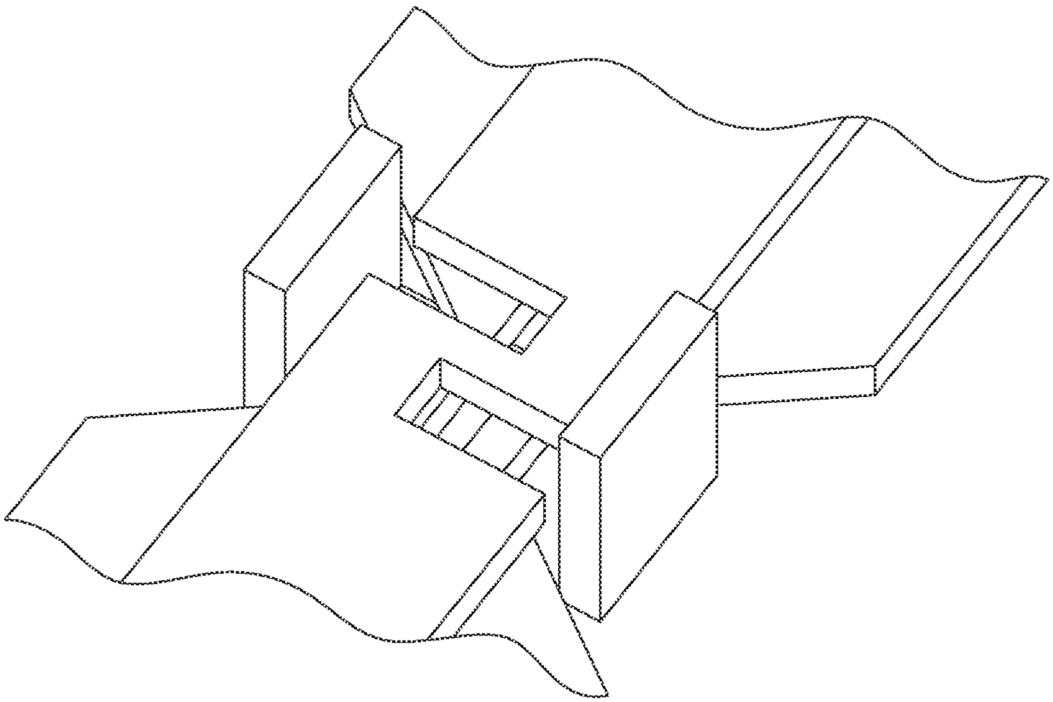
FIG. 14 is a perspective view of an embodiment in accordance with FIG. 12.

For example, two coplanar conductors, optionally including necking, may form a cross with a third conductor extending perpendicularly to the other two. Regarding the necking, FIG. 13 shows necking on two coplanar bus bars surrounded by the shield. The width is reduced, becoming progressively narrower. The cross section is smaller in the necking than in the rest of the bus bar. For example, the necking can be as narrow as desired as long as resistance is so high that losses start affecting the current. The necking may have a wedge shape. In some embodiments, the width of the narrow part due to the necking may be less or equal to half the conductor width, or less or equal to ⅓ the conductor width, or even less or equal to ⅕ the conductor width. The necking is done on both conductors to increase the current density. Additionally, the necking is placed in a region where the bus bars are close to each other, and where the sensor will be positioned.

A third conductor can be added to the configuration shown in FIG. 13. The third conductor may be positioned on a different plane of the coplanar bus bars and parallel to them. However, the portion overlapping the necking, is positioned between two cutouts which force the current in a perpendicular coplanar direction. A cross section of the overlapping area would correspond to the one conductor distribution shown in FIG. 12.

Figure 15:
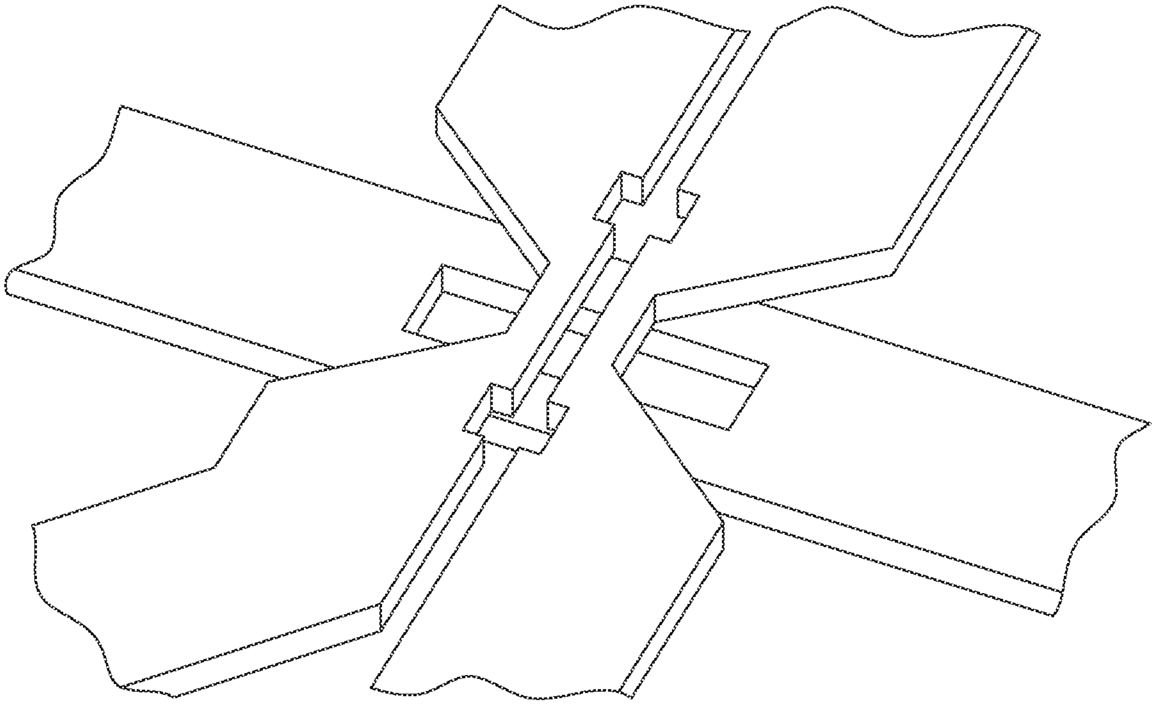
FIG. 15 is a perspective view of three bus bars, two of them coplanar, parallel and including necking, the third one being in a different plane extending in a plane parallel to the plane of the coplanar bus bars. The third bus bar includes a hole or slit.

Optionally the third conductor may comprise a hole in the overlapping area. This is shown in the alternative embodiment of FIG. 15, wherein holes are shaped between the conductors to fit a shielding system such as the shield 300 of FIG. 8. Optionally, the current sensor (or at least the magnetic sensing means thereof) may be included inside the hole.

For example, the three conductors may extend in the same direction. Two of them may be coplanar and the third may overlap the gap between the other two. The region of the conductor to be sensed by the current sensor may comprise features to force the current in a perpendicular direction to the currents through the other two conductors. These features may be cutouts as explained with reference to FIG. 9. Optionally the two coplanar conductors may comprise a local necking in the region to be sensed, to increase the current density as before.

The particular distribution of the conductors relative to the magnetic sensor of the current sensor confers symmetry to the matrix, as with the case of two conductors. In this case:

$$\begin{pmatrix} Bx \\ By \\ Bz \end{pmatrix} = \begin{pmatrix} Gx & Gx & 0 \\ 0 & 0 & Gy \\ -Gz & Gz & 0 \end{pmatrix} \begin{pmatrix} Iu \\ Iv \\ Iw \end{pmatrix}$$

For the calibration, three measurements are required, for example by introducing a calibrating current in one conductor at a time, so the following values of the current are obtained, and the magnetic fields are measured:

$$Iu = \text{I\_cal},\ Iv = 0,\ Iw = 0$$

$$Iu = 0,\ Iv = \text{I\_cal},\ Iw = 0$$

$$Iu = 0,\ Iv = 0,\ Iw = \text{I\_cal}$$

Thus, it is possible to solve the equations for Gx, Gy, Gz.

The processor can have a calibration done during manufacturing, and the end user only needs to properly position the magnetic sensor at the prescribed position. Optionally, the processor can be reprogrammed to provide fine adjustments, to compensate for drifting due to e.g. thermal influence or misalignments.

However, as explained earlier, misalignment can be reduced and the need for reprogramming may be reduced or avoided. The conductors may be placed within the packaged sensor, so the magnetic sensor (in particular the sensing elements) are fixed in position with the conductors, and the processor can have a calibration done during manufacturing.

Figure 16:
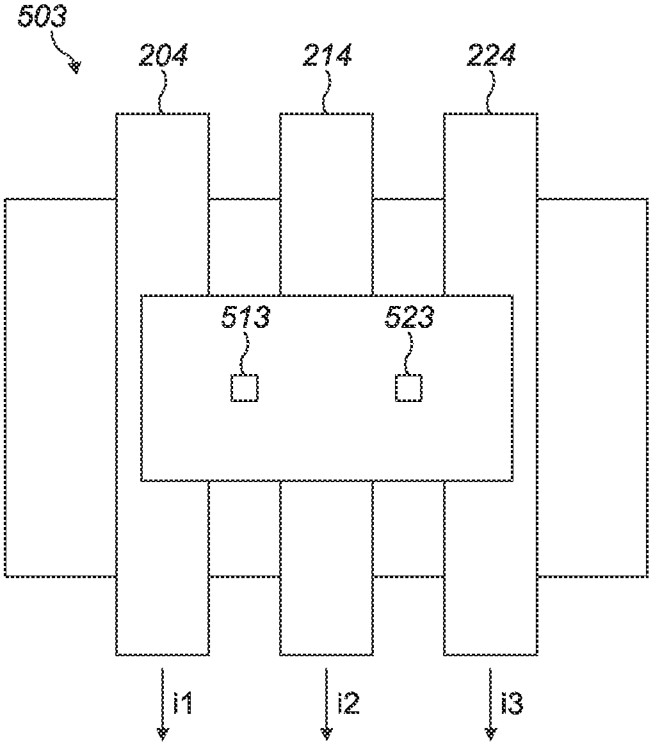
FIG. 16 illustrates an integrated current sensor including three parallel conductors.

FIG. 16 left hand shows a top view of an integrated current sensor 503, including a first magnetic sensor 513 placed over the gap (similarly as in FIG. 10) between a first conductor and second conductor, and a second magnetic sensor 523 placed optionally over the gap between the second conductor and a third conductor. Each magnetic sensor may be a 3D sensor such as the one in FIG. 2; each signal may be indicative of a component of the field. Alternatively it may comprise a MC surrounded by sensing elements, so the components in different directions of the field can be extracted and, by calculation using the magnetic sensor signals, obtaining the current through each conductor. Although three conductors are shown, the device can be used with only two conductors (a single magnetic sensor is in that case needed). In some embodiments, the processing unit receives input from each magnetic sensor. In some embodiments there are two processing units, one for each magnetic sensor.

The conductors 204, 214, 224 are integrated in the package. These conductors can receive the current to be tested. The position of the magnetic sensors is fixed with respect to the conductors, so the impact of the alignment on the results is negligible. Only small corrections, if any, need to be done in case of thermal changes or the like.

Figure 17:
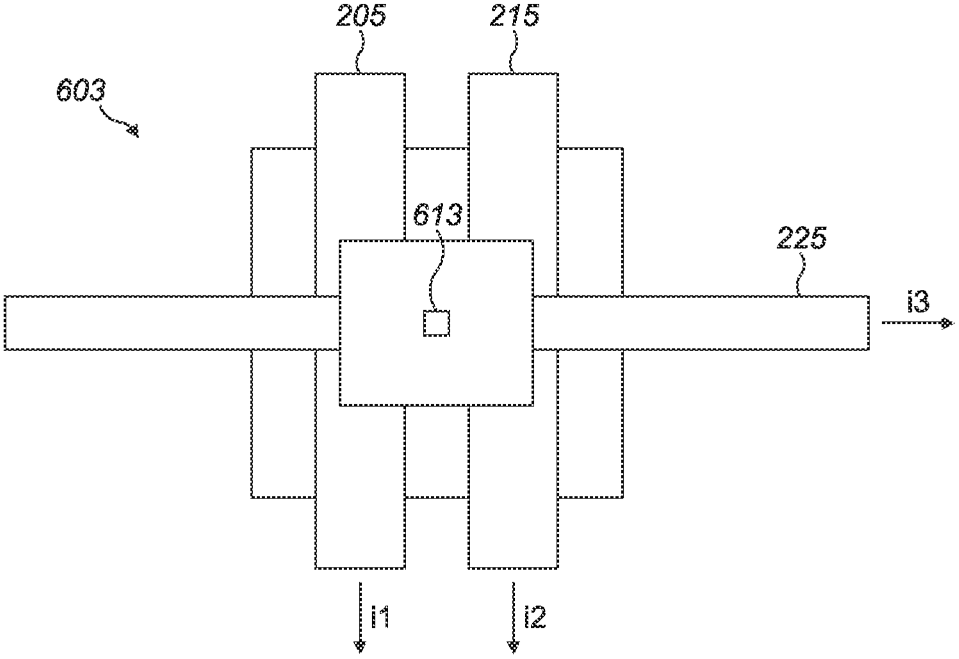
FIG. 17 illustrates another integrated current sensor including two parallel conductors and a third perpendicular conductor overlapping the other two and the magnetic sensor of the current sensor.

Another embodiment is shown in FIG. 17 right hand. The current sensor 603 may be an integrated sensor including a MC surrounded by two pairs of sensing elements distributed around the perimeter of the MC, for extracting the field components in different (perpendicular) directions. A similar example was discussed with reference to FIG. 12. However, the implementation with MC is optional, and any suitable implementation can be used for the magnetic sensor, e.g. as seen with reference to FIG. 2 or FIG. 3.

Two coplanar conductors 205, 215 are arranged so that their current flows in the same direction. Optionally, a third conductor 225 runs perpendicularly. The current sensor 603 overlaps the gap between the two coplanar conductors and is adapted to provide the signal through each conductor based on the signals detected by the magnetic sensor (e.g. Bx, Bz). If a third conductor is used, the magnetic sensor may be a 3D sensor.

In some embodiments, two perpendicular conductors 205, 225 can be used, adapting the magnetic sensor and/or position thereof accordingly.

The magnetic field components in three directions can be obtained and, from weighted combinations thereof, the current i1, i2, i3 through each conductor can be obtained.

As before, the conductors are also provided in the sensor package. The present invention is not limited to packages with three integrated conductors. A first and at least second, e.g. only two, conductors may be present. The conductors may be for example tracks including contacts for receiving the input current to be tested from the outside. One or more of the conductors may be external to the package, e.g. a PCB trace. For example, the sensor package may be provided on a PCB and, optionally, one or more of the conductors may be provided as conductive tracks on the PCB.

The invention claimed is:

1. A current sensor for sensing a first current through a first conductor and for sensing a second current through at least a second conductor different from the first, the sensor comprising:

a magnetic sensor configured to provide a first signal representative of a magnetic field parameter in a first direction and configured to provide at least a second signal representative of a magnetic field parameter in a second direction different from the first direction, the magnetic field being induced by the first and the second currents, a processing unit programmed for deriving a first output signal and a second output signal based on weighted combinations of the first signal and the at least second signal from the magnetic sensor, wherein the weights of the weighted combination are chosen such that the first output signal is indicative of the first current and the second output signal is indicative of the second current, wherein the magnetic sensor and the processing unit are provided in a single sensor package.

2. The current sensor of claim 1 wherein the processing unit is programmed with constants such that the output signal indicative of the current in one conductor is proportional to one component of the magnetic field or one gradient of the magnetic field.

3. The current sensor of claim 1 for sensing a further third current through a third conductor different from the first and second conductors, being configured to provide a third output signal representative of the third current, and wherein the processing unit is programmed for deriving the third current based on a weighted combination of the first, second and third signals.

4. The current sensor of claim 3 wherein the magnetic sensor is further configured to provide a third signal representative of a magnetic field parameter in a third direction different from the first and the second directions.

5. The current sensor of claim 1 wherein the magnetic sensor comprises at least two magnetic sensing elements.

6. The current sensor of claim 1 wherein the magnetic sensor is adapted to measure the magnetic field substantially at the same location.

7. The current sensor of claim 1 wherein the single sensor package comprises contacts for outputting processed signals from the processing unit.

8. The current sensor of claim 1 wherein a first and at least second conductors are also provided in the sensor package, wherein the current sensor is at a fixed position relative to the conductors, optionally overlapping the conductors and wherein the sensor package further comprises contacts for providing the currents to be measured through the conductors of the sensor package.

9. A sensing system comprising the current sensor of claim 1, further comprising at least a first and a second conductors, wherein the current sensor is positioned so as to measure the overlapped magnetic field induced by the conductors, optionally wherein the current sensor at least partially overlaps at least one of the conductors.

10. The system of claim 9 wherein the first conductor and second conductor are positioned so that a limited region can be defined wherein the magnetic field parameter in one direction has a null contribution from the first conductor, and the magnetic field parameter in the other direction has a null contribution from the second conductor, wherein the current sensor is positioned in said region, the current sensor being sensitive in both directions.

11. The system of claim 9 wherein the first conductor extends so that the current flows in a first direction and the second conductor extends so that the current flows in a second direction different from the first, optionally being perpendicular direction.

12. The system of claim 9 wherein each conductor is separated by a distance from the magnetic sensor of the current sensor, and wherein the spacing between at least two of the conductors less than 5 times the distance between any of the conductors and the magnetic sensor.

13. The system of claim 9 wherein a first conductor extends in a first direction and the second conductor extends parallel to the first conductor in a different plane, wherein the second conductor is a bus bar including a portion extending longitudinally, the portion being delimited by a first cutout on one side of the bus bar and a second cutout on an opposite side of the bus bar so the current through that portion travels perpendicularly to the first conductor, and wherein the current sensor receives the magnetic field from the first conductor and from the portion delimited by cutouts in the second conductor.

14. The system of claim 9 further comprising a third conductor for flowing current, wherein the current sensor is further arranged to detect the current through the third conductor, at least a portion of the third conductor being arranged parallel to any one of the first or second conductor.

* * * * *